US005592077A

United States Patent [19]

Runas et al.

[11] Patent Number: 5,592,077

[45] Date of Patent: Jan. 7, 1997

[54] CIRCUITS, SYSTEMS AND METHODS FOR TESTING ASIC AND RAM MEMORY DEVICES

[75] Inventors: Michael E. Runas, McKinney; Kirit B. Patel, Dallas, both of Tex.

[73] Assignee: Cirrus Logic, Inc., Fremont, Calif.

[21] Appl. No.: 387,218

[22] Filed: Feb. 13, 1995

[51] Int. Cl.[6] .............................. G01R 1/00; H04B 17/00

[52] U.S. Cl. ........................ 324/158.1; 371/22.4; 257/202

[58] Field of Search ........................ 324/158.1; 371/21.1, 371/24, 25.1, 26, 22.4; 321/22.5

[56] References Cited

U.S. PATENT DOCUMENTS

| | | | |
|---|---|---|---|
| 5,047,711 | 9/1991 | Smith et al. | 324/158.1 |
| 5,138,610 | 8/1992 | Fasang et al. | 371/21.1 |
| 5,230,000 | 7/1993 | Mozingo et al. | 371/22.4 |

*Primary Examiner*—Kenneth A. Wieder
*Assistant Examiner*—Barry C. Bowser
*Attorney, Agent, or Firm*—Winstead Sechrest & Minick P.C.

[57] ABSTRACT

Systems and methods for testing ASIC and RAM memory devices are disclosed. The method comprises determining a signature map of valid power supply current values for a known good microcircuit wherein each valid power supply current value is measured at a fixed level of power supply voltage and corresponds to a unique test input stimuli pattern applied to the known good microcircuit. The signature map of power supply current values is stored in an electronic memory (300). The test input stimuli patterns are then applied to an unproven microcircuit (330) and the power supply current of the unproven microcircuit is forced to the levels stored in the signature map by a current supply (360) while the voltages across the power supply inputs of the unproven microcircuit are measured by a voltmeter (340). The measured power supply voltages for each power supply current value are then compared to the fixed voltage supply level used to test the known good microcircuit. The unproven microcircuit is faulted if any measured power supply voltage of the unproven microcircuit differs substantially from the fixed power supply voltage applied to the known good microcircuit.

18 Claims, 2 Drawing Sheets

CIRCUITS, SYSTEMS AND METHODS FOR TESTING ASIC AND RAM MEMORY DEVICES

TECHNICAL FIELD OF THE INVENTION

This invention relates to systems and methods of testing integrated circuits and more particularly to circuits, systems and methods for testing ASIC and RAM memory devices.

BACKGROUND OF THE INVENTION

Functional and reliability testing of integrated circuits, particularly very large scale integrated circuits (VLSI), has long been an important aspect of the electronics industry and is becoming ever more important. Presently, chip manufacturers use various testing procedures to determine the effectiveness of their manufacturing processes (i.e., chip yield) and the viability of their circuit designs. Chip users, particularly computer manufacturers, also subject the microcircuits they purchase to reliability testing in order to evaluate the quality of the parts they receive and to insure the quality of their own finished product.

The ideal standard for reliability testing is to subject 100% of the integrated circuits produced to the most rigorous and effective tests that can be devised. In reality, however, the ideal standard is difficult to attain. This is a function of the very large number of integrated circuits currently produced, the time it would take to test all of the chips, and the cost of testing each chip, particularly high density integrated circuits, which may have tens of thousands of gates on each chip. Because 100% testing is too time consuming and prohibitively expensive, many chip manufacturers rely on sample testing in order to evaluate the performance and reliability of a given lot of integrated circuits.

Lot sample testing is unacceptable for certain types of chips, however. Dynamic random access memories (DRAMs), for example, must be subjected to 100% testing of all memory locations in order to ensure that each address is able to store data. Furthermore, some rigorous level of testing must be performed on most random access memory (RAM) chips by the computer manufacturers before installation in computers in order to minimize the effects of infant mortality on the computer manufacturing process. Thorough testing is also typically needed on application specific integrated circuits (ASICs). ASICs are semi-customized chips designed to perform very specific function required by the designer. ASIC chips are usually produced in relatively low volume and at relatively high cost per chip. The operating parameters of ASIC chips are therefore generally not as well known by the end user or as well-documented and reliable as the operating parameters of mass production chips. The ASIC user must generally rely on sparse data sheets provided in the ASIC manufacturer's specifications.

The different methods of reliability testing of integrated circuits include:

1) visual inspection;

2) $I_{ddq}$ testing—measuring the quiescent (DC) power supply current to determine power dissipation of the IC for a given set of input voltages (or test vectors);

3) burn-in testing—operating the chip for an extended period of time at a high temperature in order to "age" the chip rapidly. This is designed to weed out those chips which are in the infant mortality group before they are sold to the end users;

4) temperature cycling—operating the chip while the temperature is cycled from high temperature to very low temperature and back to high temperature in order to evaluate its performance in real-world conditions;

5) functional testing—application of test vector stimuli and reading the output logic levels (digital "zeroes" and "ones" to verify correct logic operation);

6) parametric testing—application of test vectors to determine precise voltages, currents, switching time, and/or propagation delays.

As noted briefly above, due to their expense, the majority of these tests are performed only on samples of a given lot of microcircuits, thereby reducing reliability of the results. This is especially true of mass produced chips where competition minimizes profit margins. More thorough testing of all or most of the microcircuits in a given lot is then usually reserved for RAM chips and special customers, such as NASA and the military.

The reliability of present methods of testing are also limited in their ability to detect certain kinds of faults. Traditional techniques of testing are generally vendor designed and rely on pass/fail criteria set forth in the vendors own specifications. These tests are generally simple and often fail to identify reliability faults including shorts, open circuits or other abnormalities.

There is therefore a need for circuits, systems and methods which can quickly and consistently identify faults in microcircuits, including potential hazards or latencies that are difficult to detect by traditional means and which may not become apparent until much later.

There is a still further need for circuits, systems and methods which can evaluate the reliability of integrated circuits independently from the specifications and data sheets provided by the vendor of the microcircuits.

There is a still further need for systems and methods which thoroughly and rapidly test the performance of very high-density integrated circuits, such as CMOS DRAMs, ASICs, microprocessors and related peripheral chips.

SUMMARY OF THE INVENTION

The foregoing problems inherent in the prior art are solved by the present invention which rapidly and inexpensively evaluates the performance and reliability of an integrated circuit, hereinafter referred to as a device under test (or DUT).

During the development phase of an integrated circuit, the present invention compares the theoretical operating parameters of a DUT generated by computer models with actual test parameters derived from the testing of early prototype DUTs. From this comparison, non-obvious design defects, such as cross-talk, may be detected and the design modified.

Once a design is debugged, the present invention also determines the operating characteristics of such design by testing a known good DUT under a complete set of test vectors and generating a unique signature map for each test vector. The present invention then uses the signature map to verify the reliability of an unproven DUT, typically an ASIC or high-density RAM device.

It is a primary object of the present invention to provide a method of evaluating the performance of an unproven microcircuit by (1) determining a signature map of power supply current values for a known good microcircuit, wherein each power supply current corresponds to a unique test input stimuli pattern and is measured at a fixed level of power supply voltage, (2) storing the signature map in memory, (3) applying to an unproven microcircuit a power supply voltage equal to the fixed power supply voltage applied to the known good microcircuit, (4) applying the unique test input stimuli to the unproven microcircuit, (5) measuring the power supply current of the unproven microcircuit and (6) comparing the power supply current of the unproven microcircuit with the power supply current stored in the signature map. If the power supply current of the unproven microcircuit differs from the power supply current value stored in the signature map by more than a predetermined amount, then the unproven microcircuit is faulted.

It is further object of the present invention to provide a method for evaluating the performance of an unproven microcircuit including (1) determining a signature map of power supply currents for a known good microcircuit wherein each power supply current corresponds to a unique test input stimuli pattern and is measured at a fixed level of power supply voltage, (2) storing the signature map in memory, (3) applying the unique test input stimuli patterns to an unproven microcircuit, (4) forcing the power supply current of the unproven microcircuit to the power supply current value stored in the signature map that corresponds to the unique test input stimuli pattern applied to the unproven microcircuit, (5) measuring the voltage across the power supply inputs of the unproven microcircuit, (6) comparing the measured power supply voltage of the unproven microcircuit with the fixed power supply voltage applied to the known good microcircuit and (7) faulting the unproven microcircuit if the difference in the power supply voltages exceeds a predetermined amount.

It is a further object of the present invention to provide a testing apparatus to evaluate the performance of an unproven microcircuit, including (1) an electronic memory containing a plurality of power supply current values in a signature map for a known good microcircuit, (2) a power supply coupled to an unproven microcircuit with an output voltage equal to a fixed voltage used to test the known good microcircuit, (3) an input stimuli generator for applying a test input stimuli pattern to the unproven microcircuit, (4) an ammeter for measuring the power supply current of the unproven microcircuit and (5) a processor to compare the power supply current of the unproven microcircuit and the power supply current stored in the signature map that corresponds to the applied test input stimuli pattern.

It is a still further object of the present invention to provide a testing apparatus to evaluate the performance of an unproven microcircuit including (1) an electronic memory containing a signature map of power supply current values of a known good microcircuit, (2) an input stimuli generator for applying test input stimuli patterns to the unproven microcircuit, (3) a power supply coupled to an unproven microcircuit where the output current of the power supply is equal to the power supply current value stored in the signature map that corresponds to the test input stimuli pattern applied to the unproven microcircuit, (4) a voltmeter for measuring the power supply voltage across the power supply inputs of the unproven microcircuit, and (5) a processor for comparing the measured power supply voltage across the unproven microcircuit to the fixed power supply voltage used to test the known good microcircuit.

It is a still further object of the present invention to provide an integrated circuit testing apparatus for measuring the current flow in the power supply bus of an unproven microcircuit including (1) a test mode interface bus for supplying input test vectors to the testing apparatus circuitry, (2) current measuring circuitry for measuring the current flow in the power supply bus, (3) comparator circuitry for comparing the measured current flow level against a reference level selected in response to the test vector received from the test mode interface bus.

The present invention is an improvement over the prior art because it removes uncertainties as to the reliability of most ASIC chips. The end user may independently evaluate chips by comparing the signature map of a known good DUT to the signature maps of unproven DUTs. This eliminates the need to rely on manufacturer (vendor) testing based on the manufacture's own specifications.

The present invention is a still further improvement over the prior art because the test circuit itself may be incorporated on the IC chip with the DUT it is designed to test. The present invention may therefore be implemented as a self-test when the chip is powered up, thereby allowing the user to verify the operation of 100% of the chips used.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiments depicted in FIGS. 1–4 of the drawings, in which like numbers designate like parts.

Figure 1:
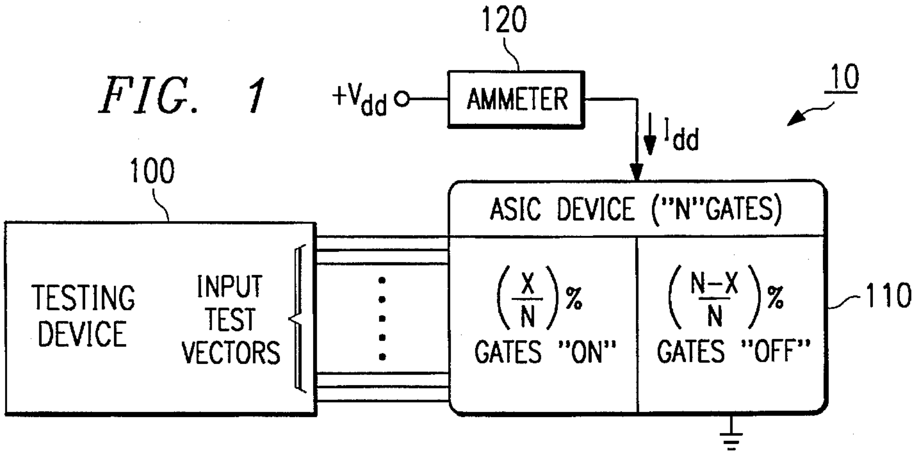
FIG. 1 is a functional block diagram of a test circuit for measuring the current $I_{dd}$ of a device under test.

FIG. 1 is a functional block diagram of a test circuit 10 which includes a testing device 100 for evaluating the operation of an ASIC device 110 containing N gates (the device under test or "DUT"). FIG. 1 shows the testing of an ASIC device; however, it should be understood that the DUT 110 could be any type of analog or digital device, including mass-produced RAMs and microprocessors. ASIC device 110 receives input test vector stimuli from testing device 100. For purposes of the present discussion, each pattern of digital stimuli simultaneously received from testing device 100 constitutes a single input test vector. For any given input test vector, ASIC device 110 dissipates a given amount of power determined by the formula $P=V_{dd}\times I_{dd}$, where $V_{dd}$ is the power supply voltage of device 110 and $I_{dd}$ is the corresponding power supply current. In the test circuit shown in FIG. 1, the power supply voltage $V_{dd}$ is held constant while different test vectors are applied to ASIC device 110. As the gates inside ASIC device 110 switch "On" and "Off," the power supply current through ASIC device 110, $I_{dd}$, changes and is measured by ammeter 120. Specifically, the value of $I_{dd}$ current is directly proportional to the percentage of "On" gates and "Off" gates (or cells) within ASIC device 110. The percentage of "On" gates is (X/N)% and the percentage of "Off" gates is ((N–X)/N)%, where "X" is the number of "On" gates. Applying different input test vectors from testing device 100 changes the On/Off state of some of the gates within ASIC device 110 and draws different amounts of current, $I_{dd}$, accordingly. For a "good" DUT, the value of current $I_{dd}$ will be within a narrow tolerance band for any given test vector. This can be used to assure that 1) the vendor's process is repeatable and reliable, 2) the ASIC device 110 design has not changed, and 3) the individual part is reliable and free from vendor defects.

Many current methods of testing apply only a few test vectors to an ASIC device while measuring the power supply current ($I_{dd}$). Such a minimal test, however, is unreliable for large scale integrated circuits which may contain over 10,000 gates and may have thousands of possible input vectors. A more reliable test method would be to apply all possible input test vectors to an ASIC device and compare the power supply current against a known band of minimum and maximum limits, thereby assuring a defect-free device from the vendor. The present invention defines fast testing techniques for creating test limits and using those limits to test unproven devices, particularly ASIC devices or CMOS DRAM devices.

Figure 2:
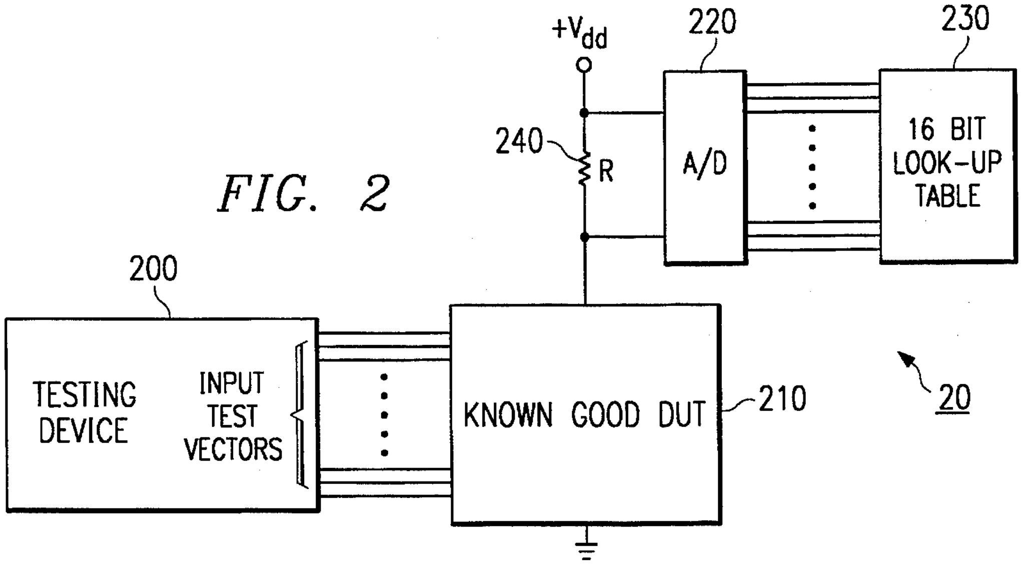
FIG. 2 is a functional block diagram of a test circuit for determining the $I_{dd}$ current parameters of a known good DUT according to the principles of the present invention.

FIG. 2 depicts a preferred embodiment of a test circuit 20 according to the present invention as it is used to test a known good DUT 210 and generate a signature map of power supply current values for a complete set of test vectors. Known good DUT 210 receives input test vector stimuli from testing device 200. The change in power supply current, $I_{dd}$, is measured by sampling the voltage across resistor 240 using A/D converter 220. In a preferred embodiment of the present invention, A/D converter 220 is a 16 to 20 bit device. Connected to the digital outputs of A/D converter 220 is memory 230, which stores a 16 bit look-up table of power supply current values. The power supply current values stored in the look-up table become the signature map of known good DUT 210. Memory 230 is synchronized with testing device 200 to sample and store the output of A/D converter 220 after each input test vector is applied and the power supply current is stable. Once a complete signature map for a known good DUT has been derived, the signature map stored in the 16 bit look-up table is then used to test an unproven DUT.

Figure 3A:
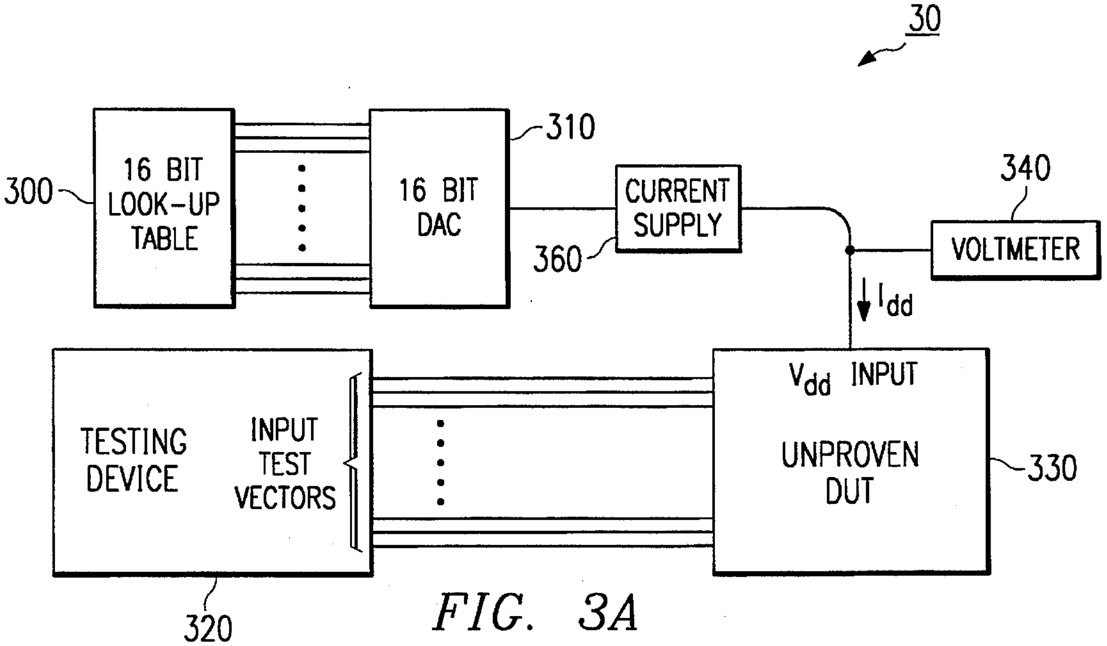
FIGS. 3A and 3B are test circuits for evaluating the performance and functionality of an unproven DUT according to the principles of the present invention.
Figure 3B:
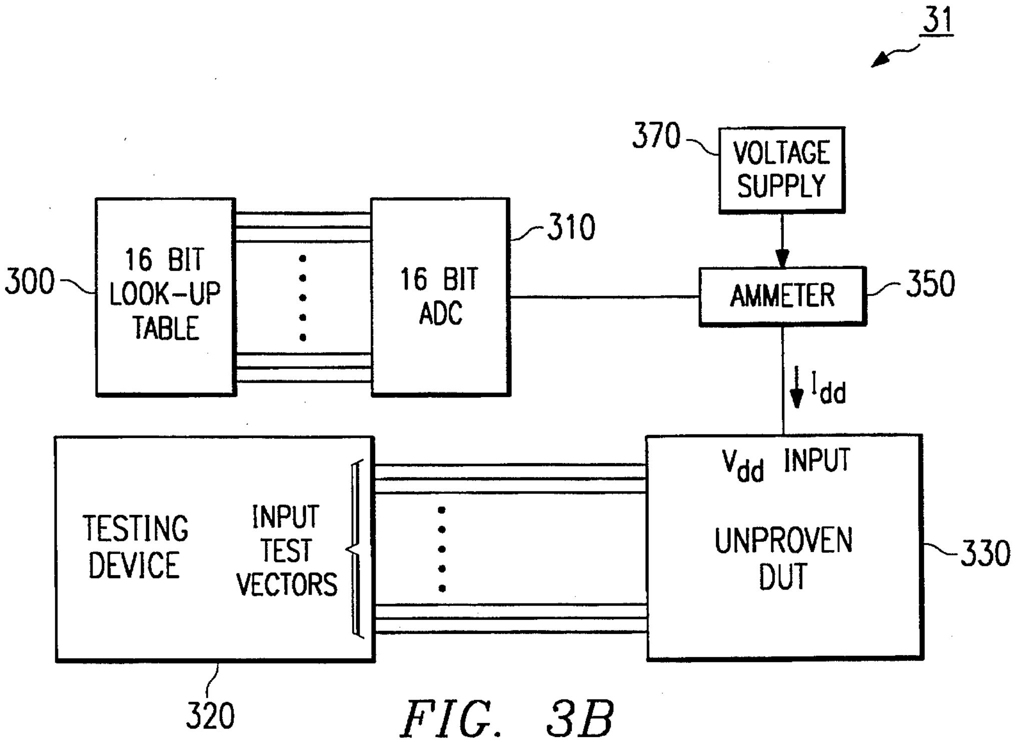

FIGS. 3A and 3B depict test circuits 30 and 31 respectively for verifying the operations of an ASIC (or memory) DUT that has an unproven reliability. As in FIG. 2, ASIC DUT 330 receives stimuli from testing device 320. The test vectors from testing device 320 are the same test vectors used in FIG. 2 by testing device 200.

There are two preferred methods for verifying the operation of DUT 330 according to the principles of the present invention. One of these methods, which is shown in FIG. 3B, is similar to the methods shown in FIG. 2. For a given input test vector the power supply voltage, $V_{dd}$, is held constant by voltage supply 370, while the power supply current, $I_{dd}$, is measured by an ammeter 350 and digitized by A/D converter 310. The measured value of power supply current, $I_{dd}$, is then compared to the value of current for that particular input test vector, as taken for a known "good" device as described above, stored in the signature map in memory 300.

However, the measurement of current with an ammeter depends on the measurement of the magnetic field induced by the power supply current and is inherently slower than the measurement of voltage, which measures electrical field strength instead. Therefore, in a preferred embodiment of the present invention, as shown in FIG. 3A, the power supply voltage, $V_{dd}$, of DUT 330 is allowed to vary while the power supply current, $I_{dd}$, is forced to fixed levels, as determined by the value stored in the signature map in memory 300. Memory 300 in FIG. 3A contains the same signature map that was previously derived by the testing of a known good DUT 210. In FIG. 3A, memory 300 applies the values in the signature map to a 16-bit (or 20 bit) D/A converter 310, which drives the output of current supply 360 to the fixed level of power supply current, $I_{dd}$, stored in memory 300. For a given input test vector and a fixed power supply current, $I_{dd}$, the power supply voltage, $V_{dd}$, is measured across the power supply pins of the unproven DUT.

Since voltage can be measured more quickly than current, the testing of DUT 330 can be performed more rapidly and efficiently. For given levels of power supply current and given input test vectors, the power supply voltage, $V_{dd}$, should stay within a narrow band of the constant power supply voltage value, $V_{dd}$, that was used in the test circuit shown in FIG. 2.

In the design and fabrication stage of a prototype ASIC or memory device, the signature map of a DUT may be derived using theoretical parameters calculated by various software design packages. For example, HSPICE, the proprietary name of a well-known software testing and design tool produced by Meta-Software, can be used to generate an initial look-up table. The operating characteristics and methods disclosed in HSPICE are hereby incorporated by reference.

Figure 4:
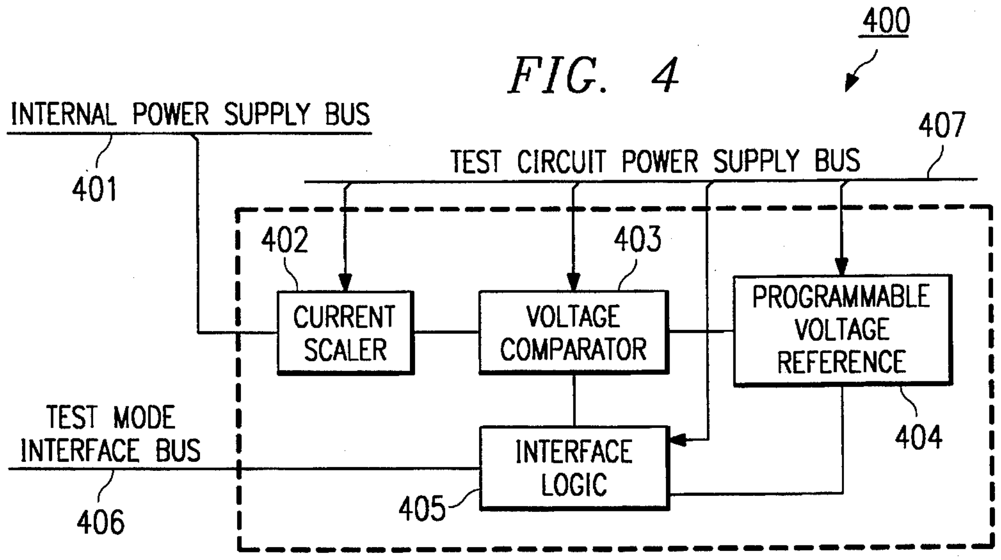
FIG. 4 is schematic diagram showing a test circuit embodying the principles of the present invention fabricated on the same IC chip as the DUT.

In some embodiments of the present invention, the test circuits shown in FIGS. 3A and 3B may be integrated onto the same microcircuit as the functional circuitry, thereby allowing the microcircuit to perform a self-test. FIG. 4 shows test circuit 400, which monitors the current flowing in internal power supply bus 401 using current scaler 402. Current scaler 402 may be a simple device, such as a resistor, or a more complicated device such as a Hall Effect sensor. Test mode interface bus 406 sends the input test stimuli applied to the unproven DUT .to interface logic 405, which controls the operations of programmable voltage reference 404 and voltage comparator 403. For a given test vector received on test mode interface bus 406, current scaler 402 measures the power supply current flowing in internal power supply bus 401. Voltage comparator 403 compares the output of current scaler 402 with the reference level of programmable voltage reference 404, which is programmed by interface logic 405 to the correct output for each given input test vector. If the power supply current is out-of-tolerance for a given input test vector, interface logic 405 sets a fault bit to indicate the device is faulty.

In the preferred embodiment of the test circuit 400 shown in FIG. 4, all of the components 402–405 are connected to an independent power supply bus 407, separate from internal power supply bus 401. In that way, current consumed by test circuit 400 is not included in the measurement of the DUT's current dissipation. In other embodiments, test circuit 400 may be on the same power supply as the DUT, but must subtract its own current dissipation from each measurement in order to determine the current consumed by the DUT.

The on-board test circuit 400 shown in FIG. 4 may advantageously be incorporated in critical microcircuits used by NASA and the military. The external test devices shown in FIGS. 2 and 3 may advantageously be applied to large scale commercial applications.

Although the present invention and its advantages have been described in detail, it should be understood that various changes, substitutions and alterations can be made herein without departing from the spirit and scope of the invention as defined by the appended claims.

What is claimed is:

1. A method for evaluating the performance of an unproven microcircuit, the method comprising the steps of:

determining a signature map of power supply current values for a known good microcircuit, wherein the signature map comprises a power supply current value measured for a fixed power supply voltage applied to a power supply input of the known good microcircuit and wherein the power supply current value corresponds to a unique test input stimuli pattern applied to data inputs of the known good microcircuit;

storing the signature map in an electronic memory;

applying a voltage equal to the fixed power supply voltage to a power supply input of the unproven microcircuit;

applying to data inputs of the unproven microcircuit the unique test input stimuli pattern;

measuring the power supply current of the unproven microcircuit;

comparing the measured power supply current of the unproven microcircuit with the power supply current value stored in the signature map corresponding to the unique test input stimuli pattern; and faulting the unproven microcircuit if the measured power supply current of the unproven microcircuit differs from the power supply current value stored in the signature map by more than a predetermined amount.

2. The method as set forth in claim 1 wherein the step of determining a signature map is performed by a computer modeling algorithm and wherein the known good microcircuit is a theoretical model microcircuit, the fixed power supply voltage and the unique test input stimuli pattern are theoretical data inputs, and the power supply current value in the signature map is a data output calculated by the computer modeling algorithm.

3. The method as set forth in claim 1 wherein the signature map comprises a plurality of power supply current values.

4. The method as set forth in claim 3 wherein each power supply current value corresponds to a unique test input pattern contained in a plurality of test input stimuli patterns.

5. The method as set forth in claim 4 wherein the step of applying comprises the step of applying at least one of said plurality of test input stimuli patterns.

6. The method as set forth in claim 3 wherein said step of determining comprises the substep of sampling a voltage appearing across a resistor coupling the power supply with the power supply input of the known good microcircuit using an analog to digital converter.

7. The method as set forth in claim 3 wherein said step of measuring the power supply current of the unproven microcircuit comprises the substeps of:

measuring the power supply current using an ammeter; and digitizing the measured power supply value using an analog to digital converter.

8. The method as set forth in claim 3 wherein the known good microcircuit is identical in type to the unproven microcircuit.

9. A method for evaluating the performance of an unproven microcircuit, the method comprising the steps of:

determining a signature map of power supply current values for a known good microcircuit, wherein the signature map comprises a power supply current value measured for a fixed power supply voltage applied to a power supply input of the known good microcircuit and wherein the power supply current value corresponds to a unique test input stimuli pattern applied to data inputs of the known good microcircuit;

storing the signature map in an electronic memory;

applying to data inputs of the unproven microcircuit the unique test input stimuli pattern;

forcing the power supply current on a power supply input of the unproven microcircuit to the power supply current value stored in the signature map that corresponds to the unique test input stimuli pattern applied to the unproven microcircuit;

measuring the power supply voltage of the unproven microcircuit;

comparing the measured power supply voltage of the unproven microcircuit with the fixed power supply voltage; and faulting the unproven microcircuit if the measured power supply voltage of the unproven microcircuit differs from the fixed power supply voltage by more than a predetermined amount.

10. The method as set forth in claim 9 wherein the step of determining a signature map is performed by a computer modeling algorithm and wherein the known good microcircuit is a theoretical model microcircuit, the fixed power supply voltage and the unique test input stimuli pattern are theoretical data inputs, and the power supply current value in the signature map is a calculated data output of the computer modeling algorithm.

11. The method as see forth in claim 9 wherein the signature map comprises a plurality of power supply current values.

12. The method as set forth in claim 11 wherein each power supply current value corresponds to a unique test input pattern contained in a plurality of test input stimuli patterns.

13. The method as set forth in claim 12 wherein the step of applying comprises the step of applying at least one of said plurality of test input stimuli patterns.

14. The method as set forth in claim 9 wherein said step of determining comprises the substep of sampling a voltage appearing across a resistor coupling the power supply with the power supply input of the known good microcircuit using an analog to digital converter.

15. The method as set forth in claim 9 wherein the known good microcircuit is identical in type to the unproven microcircuit.

16. An apparatus for testing the performance of an unproven microcircuit, said apparatus comprising:

an electronic memory containing a plurality of digital data comprising a signature map of power supply current values of a known good microcircuit identical in type to said unproven microcircuit, wherein said plurality of power supply current values are measured at a fixed power supply voltage applied to a power supply input of said known good microcircuit and wherein each power supply current value in said plurality of power supply current values corresponds to a unique test input stimuli pattern contained in a plurality of test input stimuli patterns applied to said known good microcircuit;

a power supply coupled to said unproven microcircuit, wherein a voltage output of said power supply is equal to said fixed power supply voltage;

an input stimuli generator for applying at least one of said plurality of test input stimuli patterns to said unproven microcircuit;

a current measuring device for measuring the power supply current of said unproven microcircuit; and processing means for comparing said measured power supply current of said unproven microcircuit to one of said plurality of power supply current values stored in said signature map which corresponds to said at least one test input stimuli pattern applied to said unproven microcircuit.

17. An apparatus for testing the performance of an unproven microcircuit, said apparatus comprising:

an electronic memory containing a plurality of digital data comprising a signature map of power supply current values of a known good microcircuit identical in type to said unproven microcircuit, wherein said plurality of power supply current values are measured at a fixed power supply voltage applied to a power supply input of said known good microcircuit and wherein each power supply current value in said plurality of power supply current values corresponds to a unique test input stimuli pattern contained in a plurality of test input stimuli patterns applied to said known good microcircuit;

an input stimuli generator for applying at least one of said test input stimuli patterns to said unproven microcircuit;

a power supply coupled to said unproven microcircuit, wherein a current output of said power supply is equal to a power supply current value corresponding to said at least one test input stimuli pattern applied to said unproven microcircuit;

a voltage measuring device for measuring the power supply voltage of said unproven microcircuit; and processing means for comparing said measured power supply voltage of said unproven microcircuit to said fixed power supply voltage.

18. An integrated circuit comprising:

a power supply bus;

a test mode interface bus for carrying test vectors;

circuitry for measuring current flow level in said power supply bus; and circuitry for comparing the measured current flow level against a reference level, said reference level selected in response to a test vector received from said test mode interface bus, wherein said circuitry for measuring and said circuitry for comparing receive power from a dedicated test circuitry power supply bus.

* * * * *